(12) United States Patent
Marsh

(10) Patent No.: US 7,078,326 B1
(45) Date of Patent: Jul. 18, 2006

(54) NUCLEATION METHOD FOR ATOMIC LAYER DEPOSITION OF COBALT ON BARE SILICON DURING THE FORMATION OF A SEMICONDUCTOR DEVICE

(76) Inventor: Eugene P. Marsh, 1722 Picabo Ct., Boise, ID (US) 83716

( * ) Notice: Subject to any disclaimer, the term of this patent is extended or adjusted under 35 U.S.C. 154(b) by 0 days.

(21) Appl. No.: 11/039,564

(22) Filed: Jan. 19, 2005

(51) Int. Cl.
*H01L 21/00* (2006.01)
*H01L 21/443* (2006.01)

(52) U.S. Cl. .................... 438/584; 438/648
(58) Field of Classification Search ............ 438/597, 438/584, 648
See application file for complete search history.

(56) References Cited

U.S. PATENT DOCUMENTS 6,346,477 B1 * 2/2002 Kaloyeros et al. .......... 438/680
6,527,855 B1 * 3/2003 DelaRosa et al. ............ 117/89

OTHER PUBLICATIONS

Park et al., "A New ALD-TiN/CoSi2 Contact Plug Process for reliable and Low Defect Density Bit-Line Integration in Sub-Quarter Micron Giga-bit DRAM", Jun. 2002, IEEE 2002 Interconnect technology Conference, pp. 282-284.*

"Gas Phase Cleaning of Silicon Wafer Surfaces", Anthony J. Muscat, Engineering Research Center for Environmentally Benign Semiconductor Manufacturing.

"Atomic Layer Deposition of Transition Metals", Lim, et al., Nature Materials, vol. 2, Nov. 2003, pp. 749-754.

* cited by examiner

*Primary Examiner*—Evan Pert
(74) *Attorney, Agent, or Firm*—Kevin D. Martin

(57) ABSTRACT

A method used to form a cobalt metal layer on a silicon surface using an atomic layer deposition (ALD) process comprises a treatment of the silicon surface prior to cobalt formation. Treatment includes serial exposure to one or more cycles comprising a titanium nitride precursor or a tantalum nitride precursor, followed by an optional exposure to ammonia. After this treatment, the silicon surface is exposed to a metal organic cobalt such as cyclopentadienyl-cobalt dicarbonyl to form a cobalt precursor on the silicon surface, which is then exposed to hydrogen or ammonia to reduce the precursor to an ALD cobalt metal layer. Once this initial metal layer is formed, additional cobalt ALD layers may be completed to form a cobalt metal layer of a desired thickness.

22 Claims, 6 Drawing Sheets

NUCLEATION METHOD FOR ATOMIC LAYER DEPOSITION OF COBALT ON BARE SILICON DURING THE FORMATION OF A SEMICONDUCTOR DEVICE

FIELD OF THE INVENTION

This invention relates to the field of semiconductor manufacture and, more particularly, to a method for forming a pure metal cobalt layer on a bare, clean silicon surface using atomic layer deposition.

BACKGROUND OF THE INVENTION

During the manufacture of semiconductor devices such as dynamic random access memories, static random access memories, logic devices, and microprocessors, several structures are commonly formed. For example, conductive interconnects such as word lines, and conductive plugs such as digit line contact plugs, are commonly used.

A common engineering goal during the design of semiconductor devices is to manufacture as many features in a given area as possible. An obvious method to aid in accomplishing this goal is to make feature sizes smaller. One problem resulting from smaller feature sizes is that decreasing the width of a conductive line or conductive plug decreases the cross-sectional area of the line or plug, which in turn increases the resistance of the feature. Features which were originally manufactured from only conductively-doped polysilicon, which has a relatively high resistance, required the formation of a lower resistance material to decrease the overall resistance of the feature, for example an overlying layer of silicide such as tungsten silicide.

As device feature sizes further decrease it becomes desirable to form the entire feature from a highly conductive material such as a metal, for example cobalt. Deposition techniques for metals include various methods. During one sputter process, a target manufactured from the deposition material may be bombarded with ions to erode the material from the target and redeposit it onto a semiconductor wafer substrate assembly. In another sputter process, the target material may be reacted with gas phase species to form compound films. During chemical vapor deposition (CVD), gasses are mixed within a chamber and chemically combine on the wafer substrate surface to form a film. Both sputtering and CVD result in the continued increase in thickness of the material layer being deposited during the process. As long as the process continues the thickness of the layer increases. Both CVD and sputtering can be used to deposit oxides, nitrides, and metals.

Thickness uniformity of a layer formed by either CVD or sputtering depends on a variety of factors. For CVD, the gasses to be combined must be dispersed uniformly above the surface receiving the layer to be deposited, otherwise the layer may form to a greater thickness in the areas of higher gas concentrations. The uniformity of a sputtered layer is highly dependent on the topography of the surface receiving the deposited layer. Since the deposition process is line-of-sight, it is difficult to deposit films in the bottom of a deep feature having a high aspect, or depth to width, ratio.

Another method used to form a layer is atomic layer deposition (ALD). With ALD, a precursor is introduced within a chamber to bond with free binding sites on the surface of the wafer substrate assembly to form a layer which is a single atom or molecule thick. Once all the binding locations are full, chemical deposition stops regardless of how much vapor remains in the chamber. This precursor gas is purged from the chamber and a reaction gas is introduced which reacts with the adsorbed precursor until all surface sites are reacted, saturating the surface and regenerating a surface which will again react with the precursor. ALD has an advantage over CVD and sputtering in that it forms a highly conformal layer over severe topography. ALD is typically used to form dielectrics such as oxides and nitrides, for example metal oxides and metal nitrides. The deposition of some pure metals with ALD has also been proven to be possible. However, the formation of pure metal cobalt on bare silicon, for example by exposing bare silicon to a cobalt precursor, has not proven possible. Cobalt can be formed on a bare silicon wafer but only after the wafer has been exposed to air for at least 15 minutes. During this time the wafer surface becomes fully hydrated, or the first monolayer of oxide is formed. Thus ALD cobalt can typically only be grown on this thin oxide/oxygen layer. Oxide/oxygen formation has deleterious effects, for example increasing the resistance between the silicon wafer and a cobalt/cobalt silicide contact.

A method which enables atomic layer deposition of a metal such as cobalt on atomically clean bare silicon would be desirable.

SUMMARY OF THE INVENTION

An embodiment of the present invention comprises a method of forming a layer of cobalt metal on bare silicon using an atomic layer deposition process.

In accordance with one embodiment of the invention a semiconductor wafer substrate assembly is cleaned by exposure to a deoxidizer such as hydrofluoric acid to remove any native oxide or contaminants and to provide a surface region of clean, bare silicon. Next, the wafer is placed into a deposition chamber, or remains in a chamber from prior processing, and the wafer, specifically the bare silicon, is subjected to one or more cycles of exposure to a tantalum nitride precursor or to a titanium nitride precursor, a purge of the chamber, and then an optional exposure to ammonia. This process treats the bare silicon and prepares it to accept bonding with a cobalt precursor layer.

After such treating of the bare silicon, the deposition chamber is purged and a cobalt precursor, particularly a metal organic cobalt such as cyclopentadienylcobalt dicarbonyl, is introduced into the deposition chamber. After exposing the bare silicon to the cobalt precursor, the silicon is exposed to ammonia to reduce the cobalt precursor to produce a cobalt metal layer which may be used as a nucleation (seed) layer.

Additional cobalt formation acts may then be performed using the nucleation layer as a base to form a thicker cobalt metal layer, for example, using cobalt ALD. If the feature is not already self-aligned from being formed on exposed silicon during a self-aligned silicide process (i.e. a "salicide" process), the cobalt metal may be patterned and etched to form a desired feature, or can be annealed to react the cobalt metal with the bare silicon to form a cobalt silicide feature.

This method may be used to form a semiconductor device having at least one, and more commonly several, atomic monolayers of cobalt metal disposed on a silicon surface such as a bare, unoxidized silicon surface. This formation is believed to result from a structure comprising a thin tantalum or titanium layer on the bare silicon surface, terminated with dimethylamine groups. A subsequent exposure to ammonia is believed to result in an in-process semiconductor device having an $NH_2$-terminated silicon surface. A resultant structure comprises a silicon substrate, at least one polysilicon feature thereon, and a layer of self-aligned cobalt silicide (i.e. "cobalt salicide") covering the at least one polysilicon feature. Another resultant structure comprises a silicon substrate, at least one polysilicon feature thereon, a layer of cobalt silicide covering the at least one polysilicon feature and a layer of cobalt metal covering at least a portion of the silicon substrate.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
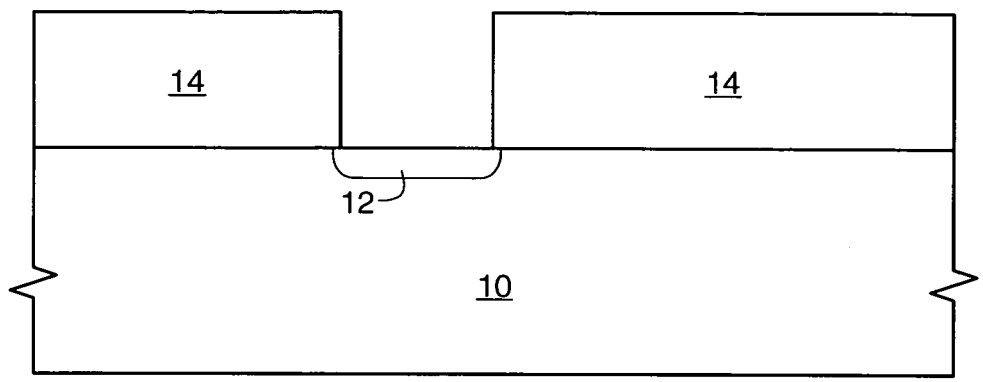
FIGS. 1–4 are cross sections depicting the formation of a cobalt contact plug using an embodiment of the invention.
Figure 2:
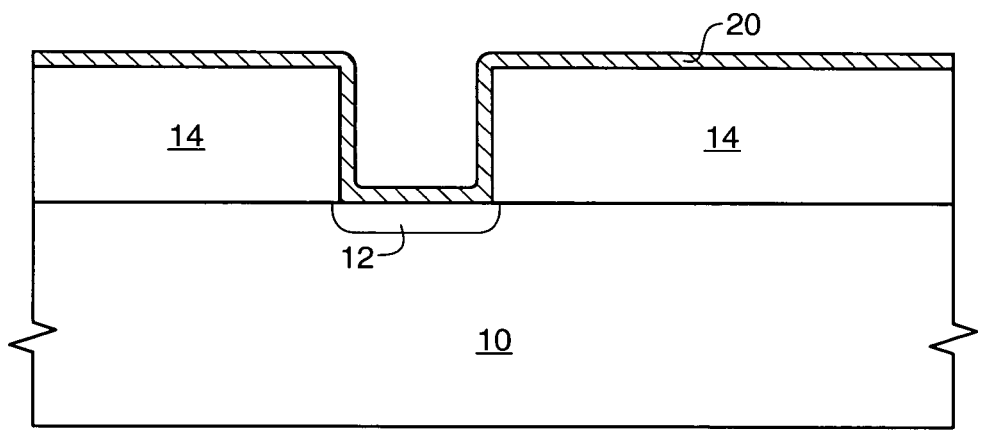

A first exemplary embodiment of an inventive method to form a cobalt layer on a bare silicon surface using atomic layer deposition (ALD) is depicted in FIGS. 1–4. FIG. 1 depicts a semiconductor wafer substrate assembly comprising a monocrystalline silicon wafer 10 having a doped region therein 12 to which a cobalt metal contact will be formed. FIG. 1 further depicts a dielectric layer 14 having an opening therein which exposes doped region 12. The opening may be formed using a patterned photoresist layer to etch the dielectric. It is likely that the completed FIG. 1 structure will comprise other features necessary for device functionality which are not immediately germane to the present invention and which, for simplicity of explanation, are not depicted or described.

The dielectric layer may include one or more layers of borophosphosilicate glass (BPSG), an oxide formed using tetraethyl orthosilicate (TEOS), a combination of both, or another oxide such as spun-on glass (SOG). The FIG. 1 structure may be formed easily by one of ordinary skill in the art using standard processing techniques.

After forming the FIG. 1 structure, the wafer, particularly the bare silicon which forms the surface of doped region 12, is exposed to a deoxidizer such as hydrofluoric acid (HF) diluted about 100:1 with water. This etchant solution will remove any native oxide (not depicted) and other contaminants from the bare silicon which forms the surface of doped region 12. Native oxide is known to form to about 12 angstroms (Å) depth on bare silicon. The wet etch will also remove about the same amount of material from oxide 14, but negative effects are negligible. An alternative to HF is an acid such as QEtch II (1% phosphoric acid, $H_3PO_4$, and 39% ammonium fluoride, $NH_4F$) which will remove native oxide from bare silicon with minimal damage or contamination to the remainder of the semiconductor wafer substrate assembly. It is also contemplated that a dry etch may be used to remove any native oxide from the silicon surface.

After exposing the silicon to the etchant to remove native oxide, the wafer is placed into a deposition chamber, or remains in such a chamber from prior processing steps. To prevent furnace hydration or the reformation of native oxide on the bare silicon after exposing the wafer to HF, the wafer must be kept in an inert ambient such as $N_2$ or the next process act must be initiated within about 15 minutes after etching away native oxide from the bare silicon.

Within the chamber the wafer is exposed to a tantalum nitride precursor or to a titanium nitride precursor. Titanium nitride precursors may have the form $Ti(NR_1R_2)_x(NR_3R_4)_{4-x}$ and $Ti(NR_1R_2)_4$, where $R_1$ through $R_4$ are organic groups. Suitable titanium nitride precursors include tetrakis(dimethylamino) titanium (chemical formula $Ti(N(CH_3)_2)_4$, hereinafter "TDMAT") and tetrakis(diethylamino) titanium (chemical formula $Ti(N(C_2H_5)_2)_4$, hereinafter "TDEAT"). Tantalum nitride precursors will typically have the form $Ta(NR_1R_2)_x(NR_3R_4)_{5-x}$ where $R_1$ through $R_4$ are organic groups. Suitable tantalum nitride precursors include (tert-Butylimino)tris (diethylamino)tantalum(V) (chemical formula $C_{16}H_{39}N_4Ta$, hereinafter "TBDET") and pentakis (dimethylamino) tantalum(V) (chemical formula $Ta(NMe_2)_5$, hereinafter "PDMAT" where "Me" is a —$CH_3$ methyl group). These precursors are available from Sigma-Aldrich Corp. of St. Louis, Mo. The selected precursor used is introduced into the deposition chamber at a flow rate of between about 0.05 sccm and about 500 sccm for a duration of between about 10 milliseconds and about 5 minutes. During the flow of, for example, TBDET, the chamber is maintained at a temperature of between about 200° C. and about 300° C. and a pressure of between about 1 millitorr and about 20 torr. Other precursors having the general forms listed above may require an expanded chamber temperature range of between about 150° C. and 450° C. Exposing the silicon to the tantalum nitride (or titanium nitride) precursor is believed to form a thin tantalum (titanium) layer on the surface of the silicon, terminated with dimethylamine groups.

After exposure of the wafer to TBDET the chamber is purged, for example with $N_2$, then ammonia ($NH_3$) is pumped into the chamber at a flow rate of between about 5 sccm and about 5,000 sccm for a duration of between about 1 second and about 30 seconds. The chamber temperature is maintained to between about 200° C. and about 300° C. and a pressure of between about 0.1 millitorr and about 20 torr. After exposing the wafer to $NH_3$, the chamber is again purged, for example with $N_2$.

While the effect of the ammonia at this point in the inventive process has not been determined, it is believed to remove the organic components of the precursor ligands to yield an $NH_2$-terminated surface. Exposure of the wafer to ammonia may reduce or eliminate carbon contamination, however, it may not be strictly necessary if a process results in the formation of a structure where carbon contamination at the interface between the wafer surface and the subsequently-formed cobalt layer is not a concern. However, it is contemplated that $NH_3$ exposure will be used in most applications of the inventive process.

The sequence of exposing the wafer to the tantalum or titanium nitride precursor, purging the chamber, exposing the wafer to $NH_3$, and again purging the chamber is referred to herein as a Precursor/$NH_3$ cycle. To maximize bonding of the cobalt layer to the bare silicon, more than one Precursor/$NH_3$ cycle may be performed, although one cycle is generally sufficient unless testing reveals enhanced benefits to the use of multiple cycles for a specific application.

After completing the Precursor/$NH_3$ cycle(s) the wafer is exposed to a metal organic cobalt such as cyclopentadienyl-cobalt dicarbonyl (chemical formula $C_5H_5Co(CO)_2$, hereinafter "$CpCo(CO)_2$"). To expose the wafer, $CpCo(CO)_2$ is introduced into the deposition chamber at a flow rate of between about 0.05 sccm and about 500 sccm for a duration of about 10 milliseconds and about 5 minutes. The CpCo $(CO)_2$ may be introduced through an inert carrier gas at a flow rate of between about 0 sccm and about 5,000 sccm. (As is known by one of ordinary skill in the art, at a carrier gas flow rate of 0 sccm some gas is injected into the chamber due to the lower chamber pressure with low pressure processes.) During the exposure the chamber is maintained at a temperature of between about 200° C. and about 500° C., and the pressure is maintained at between about 0.1 mT and about 20 torr. After $CpCo(CO)_2$ exposure the chamber is purged using an inert gas at a flow rate of between about 0 sccm and about 10,000 sccm for a duration of between about 0.01 seconds to about 50 minutes. Exposing the bare, clean treated silicon surface to the metal organic precursor results in the precursor bonding with the silicon surface.

After exposure to the metal organic precursor, a reducer such as hydrogen ($H_2$) or $NH_3$ is introduced into the chamber at a flow rate of between about 5 sccm and 10,000 sccm for between about 0.01 seconds to about 50 minutes. The $H_2$ or $NH_3$ reduces the cobalt precursor layer formed on the silicon surface to pure cobalt metal. While the mechanism has not been studied, exposing the adsorbed cobalt precursor to $NH_3$ is believed to remove the organic ligand to yield metallic cobalt.

As a result of the treatment of the bare silicon with one or more Precursor/$NH_3$ cycles to prime the exposed silicon surface with TaN or TiN, the surface termination of the bare silicon is altered and so that it accepts bonding with the cobalt precursor. Without this initial treatment, exposure of bare silicon to $CpCo(CO)_2$ does not result the bonding between the silicon surface and the cobalt precursor. After exposure of the treated surface to $CpCo(CO)_2$, a layer of adsorbed cobalt precursor remains on the silicon surface. After exposure of the adsorbed cobalt precursor to $H_2$ or $NH_3$, the structure of FIG. 2 remains, including an ALD cobalt layer 20 on the bare silicon and the dielectric layer 14.

As this is an atomic layer, it forms a uniform conformal cobalt layer a single atom thick.

The cobalt metal will likely form as an incomplete layer covering about ⅓ of the exposed surface after the initial layer of cobalt metal is formed. ALD cobalt metal formation may be continued by alternating exposure of the cobalt metal layer to $CpCo(CO)_2$, then exposing the cobalt precursor which is adsorbed to the cobalt metal to $H_2$ or $NH_3$ to reduce the cobalt precursor to metal. The chamber temperature and pressure is maintained at the above-stated values during $CpCo(CO)_2$ exposure and during exposure to the $H_2$ or $NH_3$ reducer. This cycling of $CpCo(CO)_2$/$NH_3$ is performed until a cobalt layer of desired thickness is formed, for example as depicted in FIG. 3 which comprises a cobalt layer 30 which completely fills the opening in dielectric 14.

Figure 3:
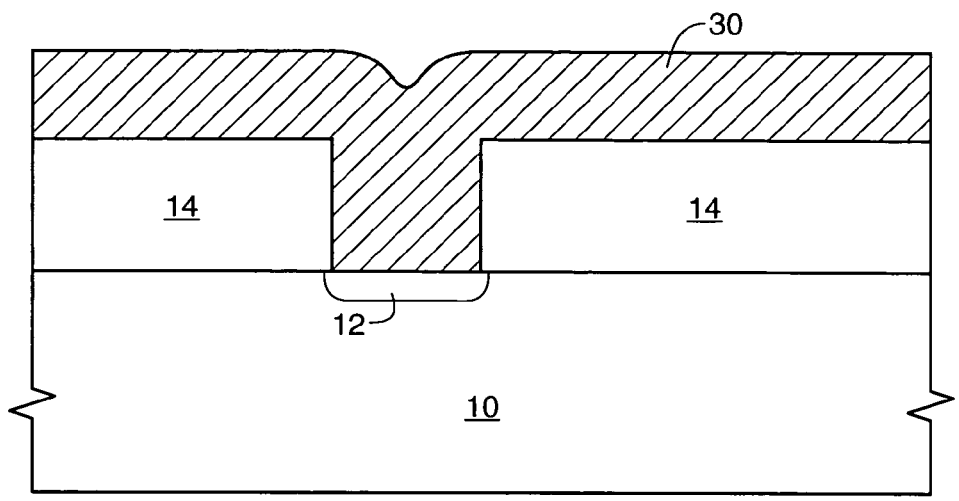
Figure 4:
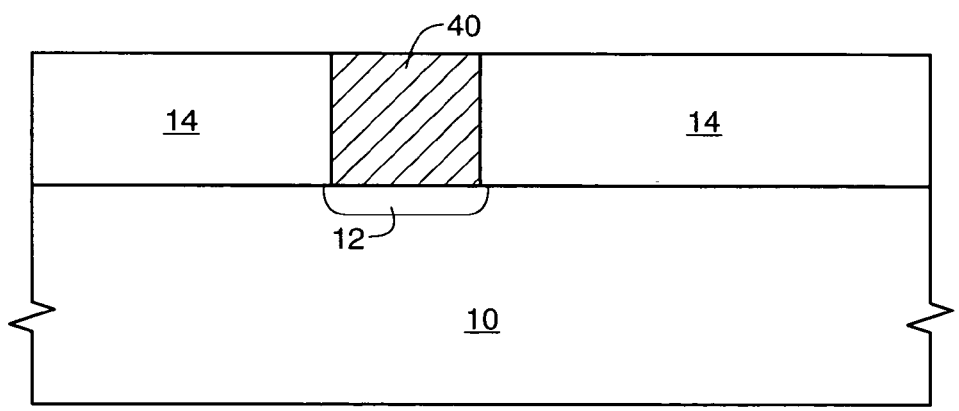

Once the structure of FIG. 3 is formed, a planarization such as chemical mechanical planarization (CMP) or other abrasive planarization may be performed to remove the cobalt from the horizontal surface of dielectric 14 to result in the cobalt plug 40 of FIG. 4. Wafer processing may then continue according to means known in the art to form a completed semiconductor device.

Figure 5:
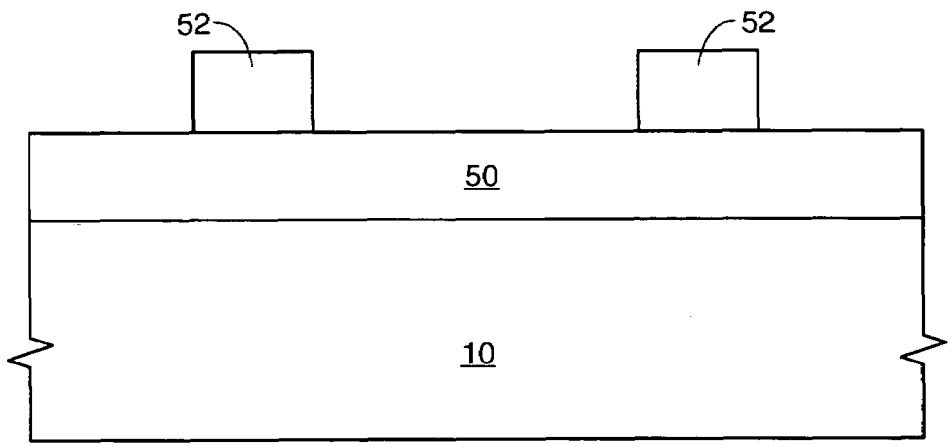
FIGS. 5–8 are cross sections depicting the formation of a self-aligned cobalt silicide structure.
Figure 6:
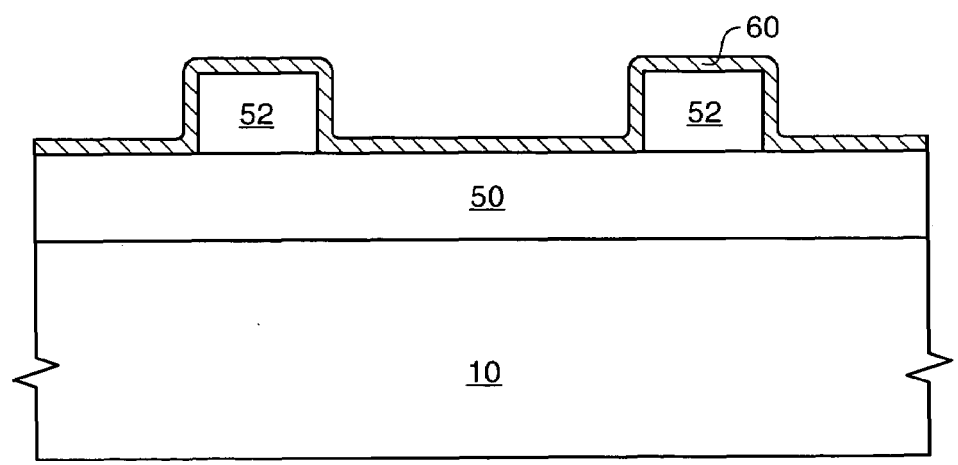

A second exemplary embodiment of the invention is depicted in FIGS. 5–8 in formation of a self-aligned silicide (i.e. "salicide") ALD conductive enhancement layer over a polysilicon feature. FIG. 5 depicts a semiconductor wafer 10 having a dielectric layer 50, such as a gate oxide or a thicker deposited oxide layer, formed over the semiconductor wafer 10. One or more silicon features, such as polysilicon interconnects, transistor gates, etc., may be formed on the dielectric layer 50 according to means known in the art. It is likely that the completed FIG. 5 structure will comprise other features necessary for device functionality which are not immediately germane to the present invention and which, for simplicity of explanation, are not depicted or described.

Next, any native oxide is removed from the polysilicon features 52, for example by exposure to one of the previously mentioned HF or QEtch II etching solutions. Then, the polysilicon features are exposed to one or more Precursor/$NH_3$ cycles using the conditions described above for the first embodiment of FIGS. 1–4. This sequence treats the polysilicon features 52 such that the features will accept bonding with a cobalt precursor.

Upon completion of exposure of the wafer to one or more Precursor/$NH_3$ cycles, the wafer surface, specifically the polysilicon features 52, is exposed to $CpCo(CO)_2$ using the conditions described above for the first embodiment, then the structure is exposed to a reducer (for example $H_2$ or $NH_3$). This process sequence results in the structure of FIG. 6, having an ALD cobalt metal layer 60 formed over the wafer surface. In this embodiment, several additional layers of ALD cobalt are formed on the initial layer by cycling $CpCo(CO)_2$/$NH_3$ until the cobalt layer is between about 5 Å and about 1,000 Å thick. As each cycle forms a cobalt layer one angstrom (about ⅓ of an atom) thick on the previous layer (i.e. three or more passes are required to form a continuous, complete, and uniform layer), the $CpCo(CO)_2$/$NH_3$ cycles may be completed between about 5 times and about 1,000 times.

Figure 7:
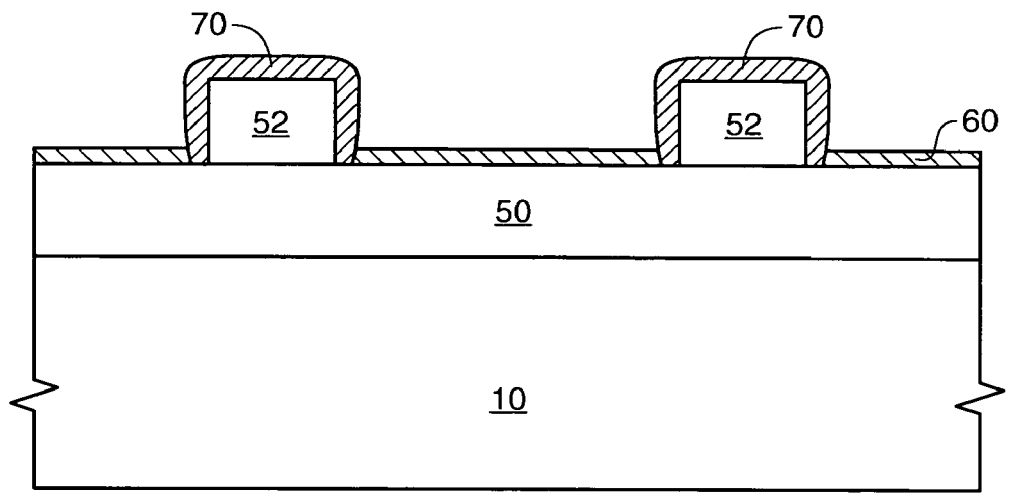

After the cobalt metal reaches a desired thickness the wafer is annealed either ex situ or in situ to react the metallic cobalt with the polysilicon to form cobalt silicide 70 as depicted in FIG. 7. One exemplary anneal may include increasing the chamber temperature to between about 400° C. to about 600° C., for example about 500° C., for between about 2.5 minutes to 60 minutes, for example about 3 minutes. The chamber temperature may then be increased to between about 700° C. to about 900° C., for example about 800° C., for between about 20 seconds to about 5 minutes, for example about 30 seconds. Pressure may be maintained to between about 1 torr and about 760 torr, for example 760 torr.

Figure 8:
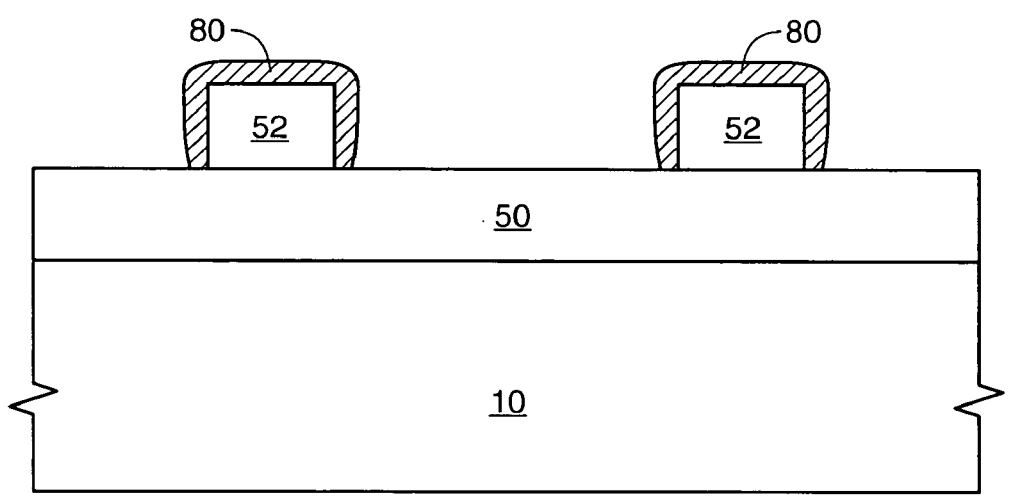

After forming the FIG. 7 structure, the unreacted cobalt metal layer 60 is etched selective to the cobalt silicide 70 using hydrochloric acid to result in the structure of FIG. 8, which comprises cobalt salicide layer 80 formed over silicon features 52. Wafer processing then continues according to techniques known in the art to form a completed semiconductor device.

In another embodiment, the cobalt layer may remain on the wafer as an unreacted cobalt layer. One contemplated use for the unreacted cobalt metal is as a portion of a digit line contact. Further, the inventive cobalt formation process may be performed subsequent to a gas phase cleaning process of the silicon wafer surface.

Figure 9:
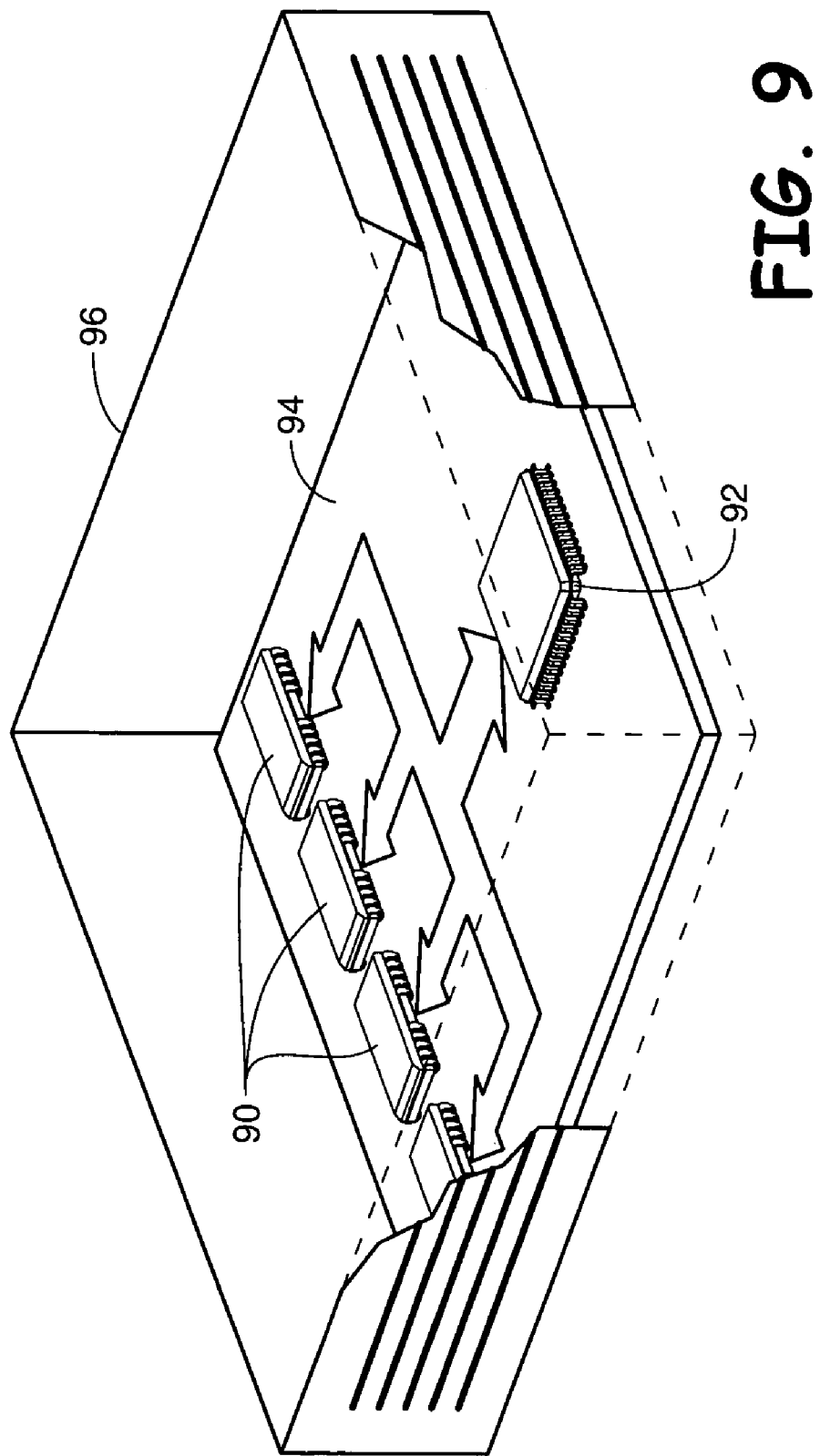
FIG. 9 is an isometric depiction of various components which may be manufactured using devices formed with an embodiment of the present invention.

As depicted in FIG. 9, a semiconductor device 90 formed in accordance with the invention may be attached along with other devices such as a microprocessor 92 to a printed circuit board 94, for example to a computer motherboard or as a part of a memory module used in a personal computer, a minicomputer, or a mainframe 96. FIG. 9 may also represent use of device 90 in other electronic devices comprising a housing 96, for example devices comprising a microprocessor 92, related to telecommunications, the automobile industry, semiconductor test and manufacturing equipment, consumer electronics, or virtually any piece of consumer or industrial electronic equipment.

Figure 10:
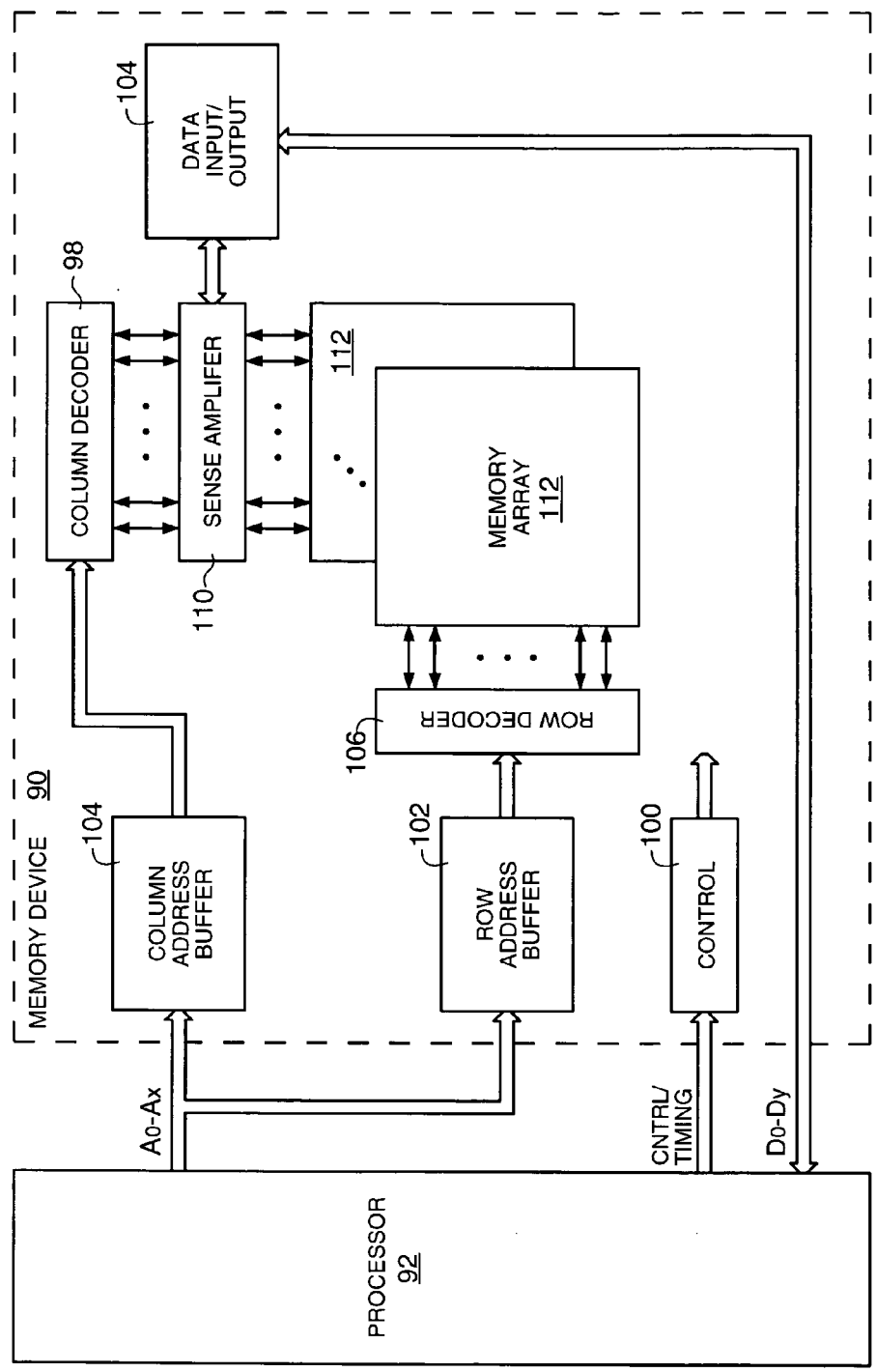
FIG. 10 is a block diagram of an exemplary use of the invention to form part of a memory device having a storage transistor array.

The process and structure described herein may be used to manufacture a number of different structures which comprise a metal or metal-containing feature. FIG. 10, for example, is a simplified block diagram of a memory device such as a dynamic random access memory having digit lines and other features which may be formed using an embodiment of the present invention. The general structure and operation of such a device is known to one skilled in the art. FIG. 10 depicts a processor 92 coupled to a memory device 90, and further depicts the following basic sections of a memory integrated circuit: control circuitry 104; row 106 and column 108 address buffers; row 110 and column 112 decoders; sense amplifiers 114; memory array 116; and data input/output 118.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

The invention claimed is:

1. A method for use in fabrication of a semiconductor device, the method comprising:
   providing a semiconductor wafer substrate assembly comprising an exposed silicon surface;
   exposing the exposed silicon surface to one of a titanium nitride precursor and a tantalum nitride precursor to form a treated silicon surface;
   exposing the treated silicon surface to a metal organic cobalt to form a cobalt precursor thereon; and
   exposing the cobalt precursor to a reducer to form a cobalt metal layer on the treated silicon surface.

2. The method of claim 1 further comprising exposing the treated silicon surface to ammonia prior to the exposure to the metal organic cobalt.

3. The method of claim 2 further comprising, prior to exposing the treated silicon surface to the metal organic cobalt and subsequent to exposing the treated silicon surface to ammonia:
   again exposing the treated silicon surface to one of the titanium nitride precursor and the tantalum nitride precursor; and
   subsequent to again exposing the treated silicon surface to the precursor, again exposing the treated silicon surface to ammonia.

4. The method of claim 1, further comprising selecting the metal organic cobalt to be cyclopentadienylcobalt dicarbonyl.

5. The method of claim 1 further comprising selecting the reducer to be a material selected from the group consisting of hydrogen and ammonia.

6. A method for use in fabrication of a semiconductor device, the method comprising:
   providing a semiconductor wafer substrate assembly comprising a silicon surface having an oxide layer formed thereon;
   exposing the semiconductor wafer substrate assembly to an etchant to remove the oxide layer to expose the silicon surface;
   treating the exposed silicon surface with one of a titanium nitride precursor and a tantalum nitride precursor;
   exposing the treated silicon surface to ammonia;
   exposing the treated silicon surface to a cobalt precursor to form a cobalt precursor layer on the treated silicon surface; and
   exposing the cobalt precursor layer to a reducer to form an atomic layer of cobalt metal on the treated silicon surface.

7. The method of claim 6 wherein the semiconductor wafer substrate assembly is exposed to a titanium nitride precursor selected from the group consisting of a compound of the form $Ti(NR_1R_2)_x(NR_3R_4)_{4-x}$ and $Ti(NR_1R_2)_4$, where $R_1$ through $R_4$ are organic groups.

8. The method of claim 6 wherein the semiconductor wafer substrate assembly is exposed to a titanium nitride precursor selected from the group consisting of tetrakis (dimethylamino) titanium and tetrakis(diethylamino) titanium.

9. The method of claim 6 wherein the semiconductor wafer substrate assembly is exposed to a tantalum nitride precursor of the form $Ta(NR_1R_2)_x(NR_3R_4)_{5-x}$ where $R_1$ and $R_2$ are organic groups.

10. The method of claim 6 the semiconductor wafer substrate assembly is exposed to a tantalum nitride precursor selected from the group consisting of (tert-Butylimino)tris (diethylamino)tantalum(V) and pentakis (dimethylamino) tantalum(V).

11. The method of claim 6 further comprising selecting the cobalt precursor to be cyclopentadienylcobalt dicarbonyl.

12. The method of claim 6 further comprising selecting the reducer to be a material selected from the group consisting of hydrogen and ammonia.

13. A method for use in fabrication of a semiconductor device, the method comprising:
   forming a patterned polysilicon layer over a semiconductor wafer substrate assembly;
   treating the patterned polysilicon layer by exposure to a metal nitride precursor;

exposing the treated polysilicon layer to ammonia;
subsequent to exposing the treated polysilicon layer to ammonia, retreating the polysilicon by exposure to the metal nitride precursor;
exposing the retreated polysilicon layer to ammonia;
exposing the retreated polysilicon layer to a cobalt precursor to form a cobalt precursor layer on the retreated polysilicon layer;
exposing the cobalt precursor layer to a reducer to reduce the cobalt precursor layer to a cobalt metal layer; and
annealing the semiconductor wafer to react the polysilicon layer with the cobalt metal layer to form cobalt silicide.

14. The method of claim 13 further comprising:
forming the cobalt metal layer on a dielectric layer during the exposure of the retreated polysilicon layer to the reducer, wherein the cobalt metal layer on the dielectric layer remains unreacted subsequent to the anneal; and
simultaneously exposing the cobalt silicide and the cobalt metal to an etchant to remove the cobalt metal and to leave at least a portion of the cobalt silicide.

15. The method of claim 14 further comprising exposing the cobalt silicide and the cobalt metal to hydrofluoric acid during the simultaneous exposure of the cobalt silicide and the cobalt metal to the etch.

16. The method of claim 13 wherein the cobalt precursor layer is a first cobalt precursor layer, the cobalt metal layer is a first cobalt metal layer, and the method further comprises, prior to annealing the semiconductor wafer:
exposing the first cobalt metal layer to the cobalt precursor to form a second cobalt precursor layer;
exposing the second cobalt precursor layer to the reducer to form a second cobalt metal layer;
repeatedly exposing exposed surfaces to the cobalt precursor and then to the reducer a sufficient number of times to form a conductive feature which is between 5 and 1,000 cobalt layers thick.

17. The method of claim 13 further comprising selecting the metal nitride precursor to be a titanium nitride precursor selected from the group consisting of tetrakis(dimethylamino) titanium and tetrakis(diethylamino) titanium.

18. The method claim 13 further comprising selecting the metal nitride precursor to be a tantalum nitride precursor selected from the group consisting of (tert-Butylimino)tris (diethylamino)tantalum(V) and pentakis (dimethylamino) tantalum(V).

19. A method for use in forming a conductive feature during the fabrication of a semiconductor device, comprising:
placing a semiconductor wafer substrate assembly into a chamber, wherein the semiconductor wafer substrate assembly comprises a semiconductor wafer having an area to which contact with the conductive feature is to be made;
removing any oxide from the area by exposing the area to a deoxidizer;
treating the area by:
exposing the area to one of a titanium nitride precursor and a tantalum nitride precursor;
exposing the area to ammonia;
introducing a metal organic cobalt into the chamber to form a cobalt precursor layer on the area;
introducing a reducer into the chamber to expose the cobalt precursor layer to the reducer and to reduce the cobalt precursor layer to cobalt metal; and
repeatedly introducing the metal organic cobalt into the chamber then introducing the reducer into the chamber a sufficient number of times to form the conductive feature from cobalt metal having about a selected thickness.

20. The method of claim 19 further comprising selecting the metal organic cobalt to be cyclopentadienylcobalt dicarbonyl.

21. The method of claim 19 further comprising performing the treatment of the area within fifteen minutes of exposing the area to the deoxidizer.

22. The method of claim 17 further comprising selecting the reducer to be a material selected from the group consisting of ammonia and hydrogen.

* * * * *